(12) United States Patent
Demos et al.

(10) Patent No.: US 6,626,185 B2
(45) Date of Patent: Sep. 30, 2003

(54) METHOD OF DEPOSITING A SILICON CONTAINING LAYER ON A SEMICONDUCTOR SUBSTRATE

(75) Inventors: Alex Demos, San Francisco, CA (US); Paul Kevin Shufflebotham, San Jose, CA (US); Michael Barnes, San Francisco, CA (US); Huong Nguyen, Danville, CA (US); Brian McMillin, Fremont, CA (US); Monique Ben-Dor, Palo Alto, CA (US)

(73) Assignee: LAM Research Corporation, Fremont, CA (US)

( * ) Notice: Subject to any disclaimer, the term of this patent is extended or adjusted under 35 U.S.C. 154(b) by 209 days.

(21) Appl. No.: 09/262,019

(22) Filed: Mar. 4, 1999

(65) Prior Publication Data

US 2001/0008138 A1 Jul. 19, 2001

Related U.S. Application Data

(63) Continuation of application No. 08/672,316, filed on Jun. 28, 1996, now abandoned.

(51) Int. Cl.⁷ .............................. B08B 7/04; B08B 7/00
(52) U.S. Cl. ..................... 134/1.1; 134/22.18; 438/680; 438/905
(58) Field of Search ..................... 134/1, 1.1, 1.3, 134/1.2, 2, 22.1, 18, 22.18; 156/345.1, 345.37, 345.33, 345.48; 118/723 AN, 723 I; 438/905, 680

(56) References Cited

U.S. PATENT DOCUMENTS

| 4,576,698 A | 3/1986 | Gallagher et al. ...... 204/192 E |
| 4,657,616 A | 4/1987 | Benzing et al. ............. 156/345 |
| 4,749,440 A | 6/1988 | Blackwood et al. ........ 156/646 |
| 4,786,352 A | * 11/1988 | Benzing ..................... 156/345 |
| 4,795,880 A | 1/1989 | Hayes et al. ........... 219/121.52 |
| 4,816,113 A | 3/1989 | Yamazaki .................... 156/643 |
| 4,842,683 A | 6/1989 | Cheng et al. ................ 156/345 |
| 4,857,139 A | 8/1989 | Tashiro et al. .............. 156/643 |
| 4,948,458 A | * 8/1990 | Ogle ....................... 156/345 X |

(List continued on next page.)

FOREIGN PATENT DOCUMENTS

| JP | 57-201016 | 12/1982 |
| JP | 61-250185 | 11/1986 |
| JP | 62-214175 | 9/1987 |
| JP | 63-267430 | 11/1988 |
| JP | 3-62520 | 3/1991 |

OTHER PUBLICATIONS

Grill, Plasma in Materials Fabrication, IEEE Press, pp. 114, 115 and 137–147, 1994.*
Grill, Cold Plasma in Materials Fabrication, IEEE Press, pp. 191–204 and 230–234, 1994.*
*Cold Plasma in Materials Fabrication—From Fundamentals to Applications*, A. Grill, 1994, The Institute of Electrical and Electronics Engineers, Inc., pps. 87–113.

Primary Examiner—Alexander Markoff
(74) Attorney, Agent, or Firm—Burns, Doane, Swecker & Mathis, LLP

(57) ABSTRACT

A plasma cleaning method for removing deposits in a CVD chamber. The method includes introducing a cleaning gas comprising a fluorine-based gas into the chamber. A plasma is formed by exposing the cleaning gas to an inductive field generated by resonating a radio frequency current in a RF antenna coil. A plasma cleaning step is performed by contacting interior surfaces of the chamber with the plasma for a time sufficient to remove the deposits on the interior surfaces. An advantage of the plasma cleaning method is that it allows for in-situ cleaning of the chamber at high rates, thereby effectively reducing equipment downtime. The method has particular applicability in the cleaning of a PECVD process chamber.

17 Claims, 2 Drawing Sheets

U.S. PATENT DOCUMENTS

| | | | |
|---|---|---|---|
| 4,960,488 A | 10/1990 | Law et al. | 156/643 |
| 5,006,192 A | 4/1991 | Deguchi | 156/345 |
| 5,011,705 A | 4/1991 | Tanaka | 427/39 |
| 5,016,663 A * | 5/1991 | Mase et al. | 134/1 |
| 5,129,958 A | 7/1992 | Nagashima et al. | 134/22.1 |
| 5,134,965 A * | 8/1992 | Tokuda et al. | 118/715 |
| 5,158,644 A | 10/1992 | Cheung et al. | 156/643 |
| 5,207,836 A | 5/1993 | Chang | 134/1 |
| 5,226,967 A * | 7/1993 | Chen et al. | 156/345 X |
| 5,261,962 A * | 11/1993 | Hamamoto et al. | 118/723 I |
| 5,346,578 A | 9/1994 | Benzing et al. | 156/345 |
| 5,356,478 A * | 10/1994 | Chen et al. | 134/1 |
| 5,413,670 A * | 5/1995 | Langan et al. | 134/1.2 |
| 5,454,903 A | 10/1995 | Redeker et al. | 216/67 |
| 5,486,235 A | 1/1996 | Ye et al. | 134/1.1 |
| 5,514,246 A | 5/1996 | Blalock | 156/643.1 |
| 5,522,934 A * | 6/1996 | Suzuki et al. | 118/723 AN |
| 5,531,862 A | 7/1996 | Otsubo et al. | 156/643.1 |
| 6,270,862 B1 * | 8/2001 | McMillin et al. | 427/569 |

* cited by examiner

METHOD OF DEPOSITING A SILICON CONTAINING LAYER ON A SEMICONDUCTOR SUBSTRATE

This application is a continuation of application Ser. No. 08/672,316, filed Jun. 28, 1996, now abandoned.

FIELD OF THE INVENTION

The invention relates to a method of cleaning a processing chamber to remove deposits which have accumulated on interior surfaces of the apparatus. For example, the method can be used to clean interior surfaces of a plasma enhanced chemical vapor deposition (PECVD) chamber in which films such as amorphous silicon, silicon oxide ($Si_xO_yH_z$), silicon nitride ($Si_xN_yH_z$), fluorinated silicon oxide ($SiO_xF_y$) or silicon oxynitride ($SiO_xN_yH_z$) can be grown on a substrate. In particular, the invention relates to plasma cleaning to remove deposits on electrodes, interior walls, gas injection apparatus, and/or other components located within a PECVD process chamber.

BACKGROUND OF THE INVENTION

It is conventional in the formation of semiconductor devices to deposit a variety of films on a substrate by plasma enhanced chemical vapor deposition. Examples of PECVD deposited films include amorphous silicon, silicon oxide ($Si_xO_yH_z$), silicon nitride ($Si_xN_yH_z$) and silicon oxynitride ($SiO_xN_yH_z$). Such processes are effective at minimizing dopant diffusion effects in the treated devices as a result of the relatively low processing temperatures required. However, the PECVD process results in deposits building up on interior surfaces inside the plasma treatment chamber. The surfaces that the deposits adhere to can include electrode surfaces, walls of the plasma treatment chamber, clamping surfaces, gas injection apparatus and any other item that the plasma comes in contact with.

These deposits on the chamber interior surfaces adversely impact both device yield and apparatus production capability. Without cleaning, the deposits can accumulate to the point at which they tend to flake off from the interior surfaces onto the substrates being processed. Also, film thickness uniformity and deposition rate can be affected by these deposits. As such, the presence of deposits on the chamber interior surfaces is undesirable. To minimize these adverse effects, the interior surfaces of PECVD chambers are periodically cleaned. However, cleaning necessarily results in equipment downtime, which can be extremely costly from a production standpoint. To mitigate these problems, various in-situ chamber cleaning processes have been described.

For instance, U.S. Pat. No. 5,454,903 discloses an in-situ plasma cleaning method for a CVD or etch reactor. The plasma is generated by RF excitation using capacitively coupled parallel plate electrodes and/or an RF antenna surrounding the reaction chamber along the length thereof. The cleaning gas comprises $C_2F_6$, which can be supplemented by the addition of $NF_3$ and He. U.S. Pat. No. 4,960,488 discloses a reactor self-cleaning process according to which a plasma is generated with RF parallel plate electrodes. A first, higher pressure gas cleaning step using fluorocarbon and oxygen gases is followed by a second, lower pressure cleaning step using a fluorinated gas, such as $NF_3$. Similarly, U.S. Pat. No. 5,158,644 discloses a reactor self-cleaning process wherein a plasma is generated by parallel plate electrodes. This method requires a first, lower pressure plasma cleaning step followed by a second, higher pressure cleaning step, and is based on fluorocarbon/$O_2$ chemistry.

U.S. Pat. No. 5,207,836 discloses plasma cleaning of an LPCVD chamber used in depositing tungsten or tungsten silicide films. The plasma is generated by a two electrode structure consisting of a grounded base/susceptor and showerhead. The cleaning gas is a fluorine based gas, such as $SF_6$, $CF_4$, $C_2F_6$ and $NF_3$.

U.S. Pat. No. 5,356,478 describes a plasma cleaning method for removing carbon, organic residues, metals, metal oxides, and aluminum-containing residues from a plasma etching chamber, which includes forming a plasma from a cleaning gas mixture comprising oxygen and a chlorine containing gas and an optional fluorine-based gas. U.S. Pat. No. 5,011,705 discloses a chamber self-cleaning method, wherein a plasma is generated by microwave electron cyclotron resonance (ECR) or parallel plate electrodes. A cleaning gas, such as $NF_3$ can be used in this process.

U.S. Pat. No. 4,786,352 describes a method of removing silicon oxide in a low pressure chemical vapor deposition (LPCVD) chamber using a cleaning gas which is decomposed to create etchant species in a plasma. Various electrode structures which extend along the length of a quartz processing chamber are used to generate the plasma. The cleaning gases include $CF_4$, $CF_4+O_2$, $C_2F_6$, $SF_6$ or $NF_3$. Other cleaning gases include $CF_3Cl$, $CF_3Br$, $Ccl_4$, $Bcl_3$, $Cl_2$, Hcl, $O_2$ and combinations with or without inert gases.

U.S. Pat. No. 4,576,698 discloses a plasma cleaning method in low pressure LPCVD systems. According to this method, a plasma is generated between an anode and a cathode, wherein the anode is inserted along the central axis of the LPCVD reaction tube and the cathode is external to and surrounds the tube. The cleaning gas used is, e.g., P.D. 100. U.S. Pat. No. 4,749,440 discloses a method of cleaning oxide deposits on quartz boats. U.S. Pat. No. 4,816,113 discloses a process of removing carbon deposits inside a chamber with a plasma generated by microwave ECR. Use of oxygen or an oxygen-containing gas instead of a fluorine or chlorine compound gas is disclosed.

Various techniques for cleaning plasma reaction chambers are disclosed in commonly owned U.S. Pat. No. 5,356,478; in U.S. Pat. Nos. 4,657,616; 4,786,352; 4,816,113; 4,842,683, 4,857,139; 5,006,192; 5,129,958; 5,158,644 and 5,207,836 and Japanese Laid-Open Patent Publication Nos. 57-201016; 61-250185, 62-214175, 63-267430 and 3-62520.

In view of the state of the art, there still exists a need for an in-situ reactor cleaning process which can be carried out at high rates, and which can effectively remove deposits on interior surfaces of PECVD reaction chambers, which deposits can adversely affect device performance and yield.

SUMMARY OF THE INVENTION

The invention provides a plasma cleaning method for removing deposits in a plasma process chamber wherein substrates are processed. For example, the plasma process chamber can form a portion of a PECVD reactor. The method includes introducing a cleaning gas comprising a fluorine-based gas into the chamber. A planar plasma is formed by exposing the cleaning gas to an inductive field generated by resonating a radio frequency current in a substantially planar coil. A plasma cleaning step is performed by contacting interior surfaces of the chamber with the plasma for a time sufficient to remove the deposits on the interior surfaces.

The plasma cleaning method according to the invention provides an in-situ method for removing deposits on interior surfaces of PECVD reaction chambers at high rates. As a result, product yield can be maintained while equipment downtime is effectively reduced. By using interferometry, the endpoint for the chamber cleaning can be determined.

DETAILED DESCRIPTION OF THE PREFERRED EMBODIMENTS

Figure 1A:
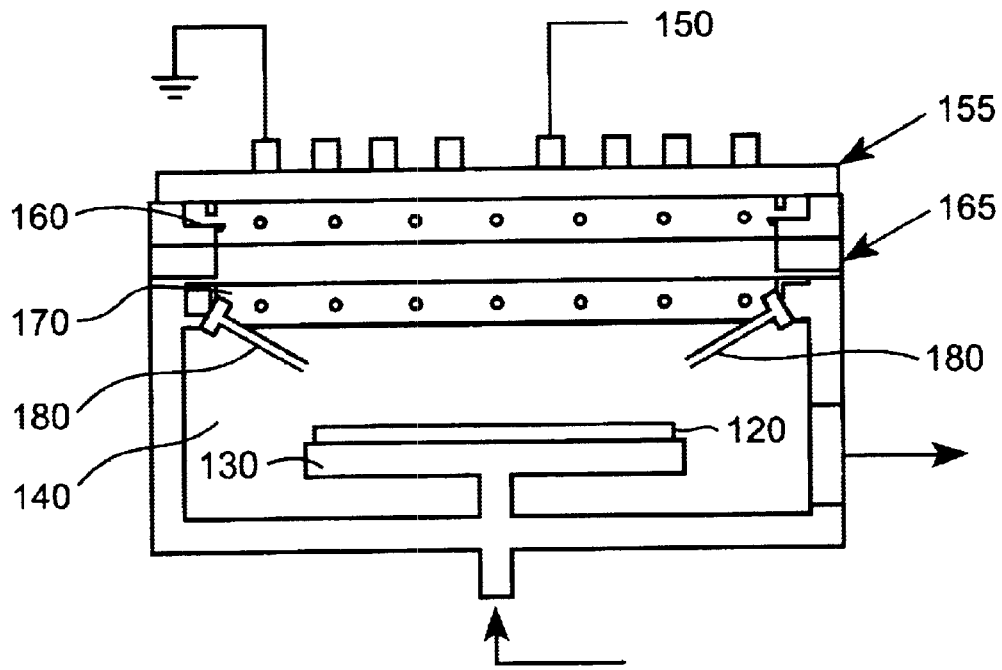
FIG. 1a illustrates a plasma processing system according to a first embodiment in which the plasma cleaning method according to the present invention may be carried out.

The invention provides a new and improved method of removing deposits formed on interior surfaces of plasma process chambers. Such deposits are formed, for example, when various films are grown in a PECVD process chamber.

The method is particularly effective in cleaning the transformer coupled plasma (TCP™, also called inductively coupled plasma or ICP) apparatus disclosed in commonly-owned U.S. Ser. No. 08/672,315, filed on even date herewith, the subject matter of which is hereby incorporated by reference. This apparatus produces a substantially planar plasma, and can be used to form PECVD films, such as plasma deposited amorphous silicon, silicon oxide, silicon nitride, fluorinated silicon oxide and silicon oxynitride. The plasma is formed in a plasma process chamber which includes at least one inlet port for introducing a process gas and at least one outlet port connected to a vacuum system for exhausting the chamber. In particular, the plasma is generated by an electrically conductive coil disposed adjacent to the exterior of the chamber. The coil is separated from the chamber interior by a dielectric shield which forms a part of an enclosure of the chamber. The coil is preferably planar or substantially planar (e.g., the coil extends axially no more than 20% of its maximum radial dimension) and can comprise a single element formed in a multiturn spiral or a series of conductive rings. By inducing a radiofrequency current within the coil, a magnetic field is produced in the chamber which induces a generally circular flow of electrons within a planar region parallel to the plane of the coil.

The type of deposits to be removed from the chamber interior depends upon the type of film(s) grown in the PECVD system. Thus, the plasma chemistry for the cleaning process is dependent upon the specific films deposited on the interior surfaces of the chamber. Fluorine-based plasma chemistry has been found to be suitable for removing films such as plasma deposited amorphous silicon, silicon oxide (including fluorinated oxides), silicon nitride and silicon oxynitride.

According to the invention, plasma formed from a cleaning gas comprising a fluorine-containing gas is used to remove deposits from the interior surfaces of a plasma process chamber. Depending on completeness of the reactions in converting the solid deposits into gaseous form, it may be possible to completely clean the plasma chamber such that no by-products remain in the chamber.

Suitable fluorine-containing gases include, for example, $NF_3$ or $SF_6$, a fluorocarbon or mixture thereof. The flow rate of the fluorine-based gas is preferably in the range of from about 200 to 500 sccm. The cleaning gas can comprise 100% by volume of the fluorine-based gas. However, the plasma cleaning gas can also include a discharge stabilizing gas, such as $O_2$, Ar, He, Ne or Kr, or chlorine-containing gas such as $Cl_2$, $BCl_3$, etc. Of these gases, $O_2$, Ar and He are preferred due to their lower costs. These discharge stabilizing gases tend to provide electrons to the plasma, thereby reducing instabilities in the plasma discharge. A flow rate of the discharge stabilizing gas is preferably in the range of from about 100 sccm or less. The cleaning gas preferably includes $\leq 50\%$ by volume of the discharge stabilizing gas.

The cleaning step can be carried out at low pressures of, for example, less than 1 Torr. This pressure is preferably in the range of from about 5 to 80 mTorr. Also, relatively high powers of, preferably, 1500 to 3000 Watts can be supplied to the RF antenna during the cleaning process. By use of low pressure and high inductive power, a high concentration of neutral activated species is present in the reaction chamber, thereby increasing cleaning rates of the chamber interior surfaces. In particular, preferred processes are as follows:

|  | $SF_6$ Cleaning Process | $NF_3$ Cleaning Process |
| --- | --- | --- |
| Chamber Pressure | 30 mTorr | 30 mTorr |
| RF Antenna Power | 2300 Watts | 2300 Watts |
| Cleaning Gas | 200–500 sccm $SF_6$ | 200–500 sccm $NF_3$ |
| Flow Rates | $\leq 100$ sccm $O_2$ |  |

The plasma cleaning step is carried out for a time sufficient to remove deposits on the interior surfaces of the chamber. Typically, the plasma cleaning step is carried out for 60–90 seconds for each micron of film to be removed from the interior surfaces. The endpoint of the chamber clean can be determined by using optical emission or interferometry, as described below with reference to FIGS. 1b and 1c.

As a result of this plasma cleaning procedure, the deposits can be removed from the interior surfaces of a plasma process chamber, in situ, without opening the chamber. Thus, the cleaning step can be performed immediately prior to or following the deposition of one or more layers on one or more semiconductor substrate in the chamber.

Use of TCP planar plasma technology with low pressures and high inductive powers during the cleaning process results in the production of a high concentration of neutral active species. These neutral active species allow for improved cleaning of the interior surfaces of the plasma chamber at unexpectedly high rates.

Figure 1B:
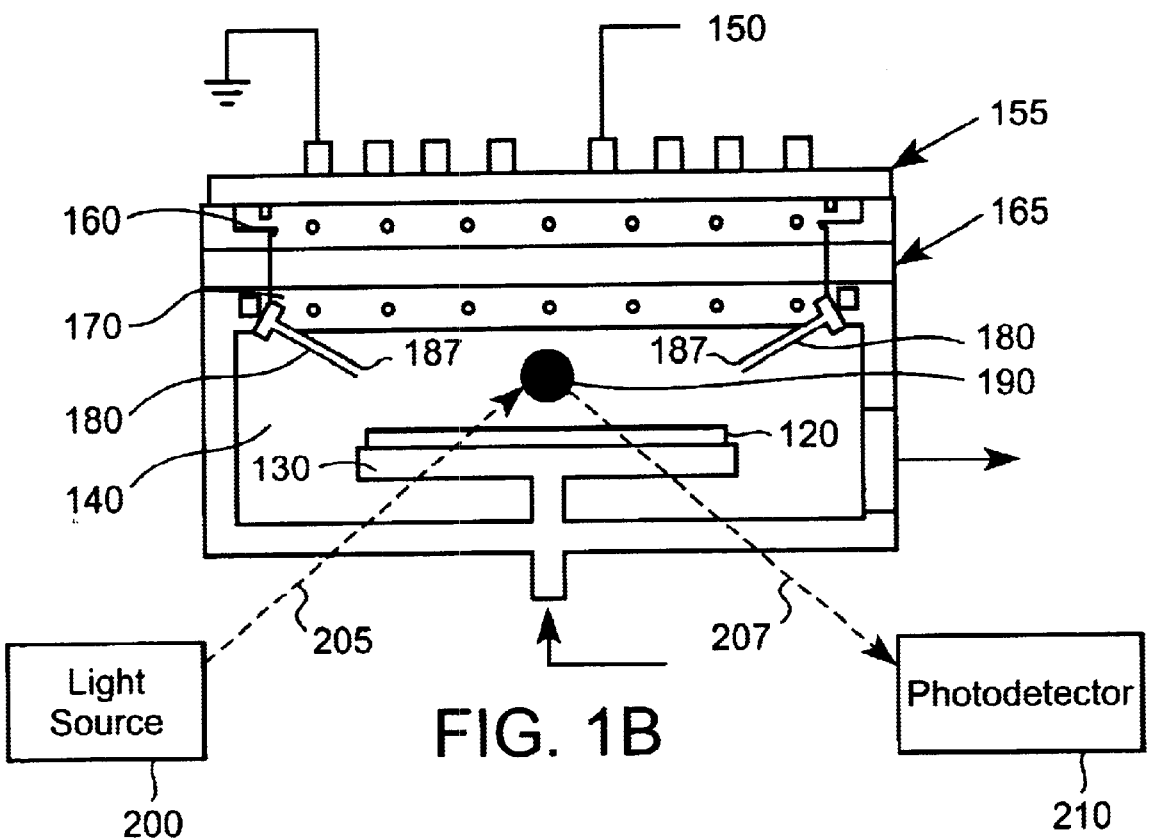
FIG. 1b illustrates a plasma processing system according to the first embodiment in which interferometry is used to determine the endpoint for chamber cleaning.
Figure 1C:
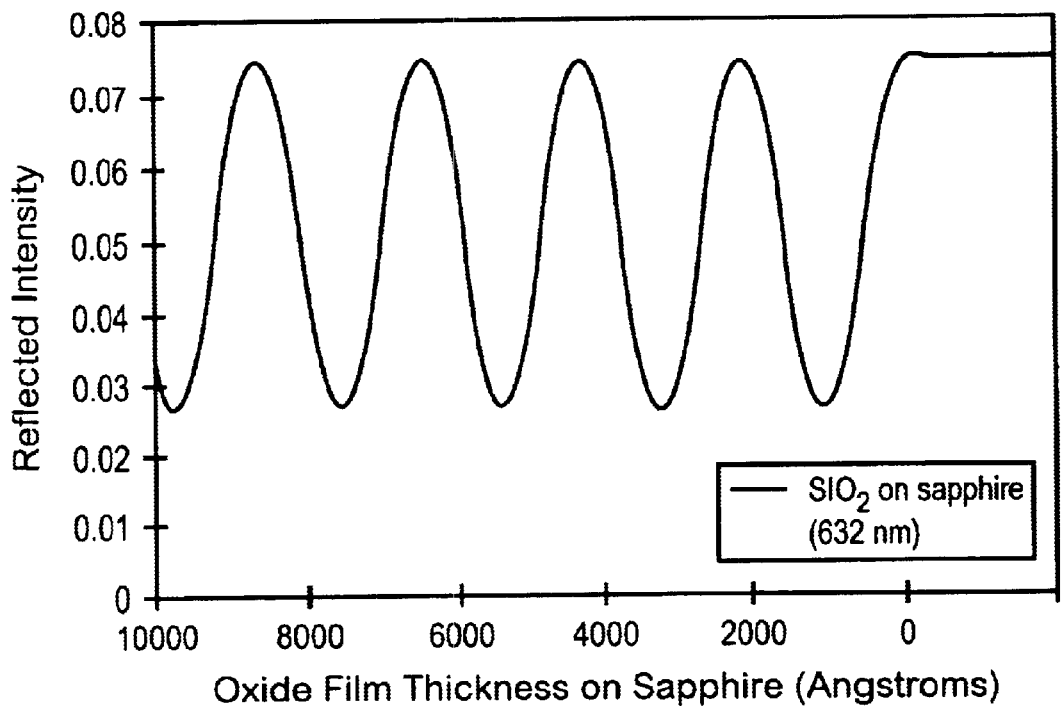
FIG. 1c shows graphically the determination of an endpoint for chamber cleaning using interferometry.
Figure 2:
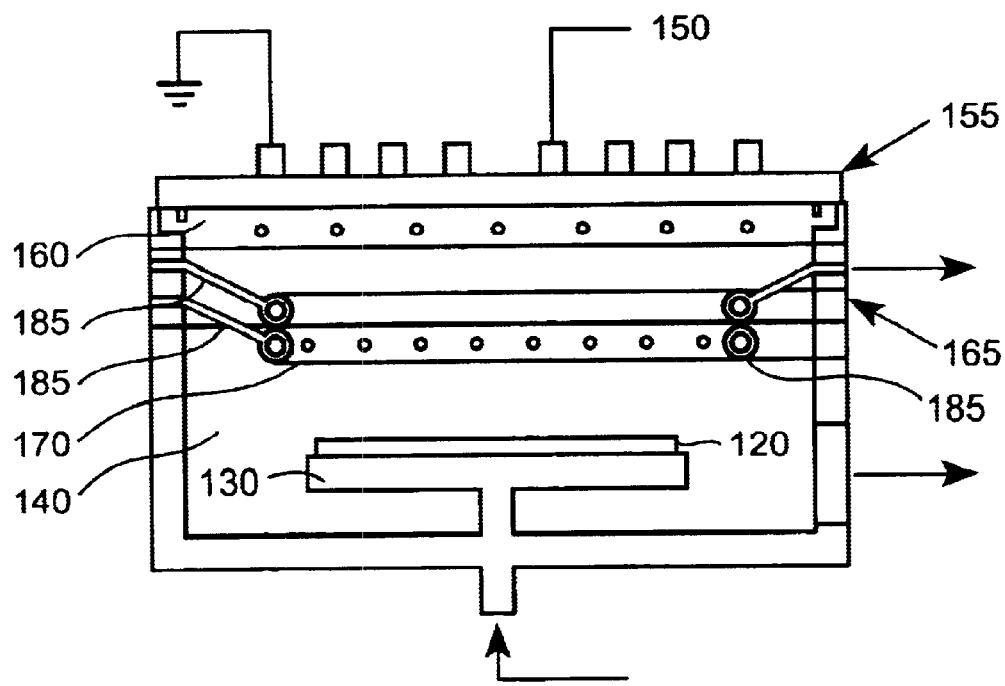
FIG. 2 illustrates a plasma processing system according to a second embodiment in which the plasma cleaning method according to the present invention may be carried out.

The cleaning method according to the invention can be carried out in an inductively coupled plasma CVD apparatus of the type shown in FIGS. 1 and 2. Details of such an apparatus are explained below.

FIG. 1a illustrates a plasma processing system according to a first embodiment of the present invention. Referring to FIG. 1a, a plasma processing system for processing a substrate 120 comprises a substrate support 130 and a processing chamber 140 enclosing the substrate support. The substrate 120 may be, for example, a semiconductor wafer having sizes such as 4", 6", 8", 12", etc., a glass substrate for making a flat panel display, and so on. The substrate support 130 may comprise, for example, a radio frequency (RF) biased electrode. The substrate support 130 may be supported from a lower endwall of the chamber 140 or may be cantilevered, extending from a sidewall of the chamber 140. The substrate 120 may be clamped to the substrate support 130 either mechanically or electrostatically. The substrate support 130 may be formed of an electrode, and an RF bias may be supplied to the electrode, preferably ranging from 0 to 2000 Watts. The processing chamber 140 may, for example, be a vacuum chamber.

A substrate to be processed is inserted into the processing chamber 140. The substrate is processed in the processing chamber by energizing a process gas in the processing chamber into a high density plasma. A source of energy maintains a high density (e.g., $10^{11}$–$10^{12}$ ions/cm$^3$) plasma in the chamber. For example, an antenna 150, such as the planar multiturn coil shown in FIG. 1, a non-planar multiturn coil, or an antenna having another shape, powered by a suitable RF source and suitable RF impedance matching circuitry inductively couples RF energy into the chamber to provide a high density plasma. The chamber may include a suitable vacuum pumping apparatus for maintaining the interior of the chamber at a desired pressure (e.g., below 5 Torr, preferably 1–100 mTorr). A dielectric window, such as the planar dielectric window 155 of uniform thickness shown in FIG. 1 or a non-planar dielectric window, is provided between the antenna 150 and the interior of the processing chamber 140 and forms the vacuum wall at the top of the processing chamber 140.

A primary gas ring 170 is provided below the dielectric window 155. The primary gas ring 170 may be mechanically attached to the chamber housing above the substrate. The primary gas ring 170 may be made of, for example, aluminum or anodized aluminum.

A secondary gas ring 160 may also be provided below the dielectric window 155. One or more gases such as Ar and $O_2$ are delivered into the chamber 140 through outlets in the gas ring 160. Any suitable gas ring may be used as the secondary gas ring 160. The secondary gas ring may be located above the gas ring 170, separated by an optional spacer 165 formed of aluminum or anodized aluminum, as shown in FIG. 1a. Alternatively, although not shown the secondary gas ring 160 may be located below the gas ring 170, in between the gas ring 170 and the substrate 120, or the secondary ring 160 may be located below the substrate 120 and oriented to inject gas vertically from the chamber floor. Yet another alternative is that Ar and $O_2$ may be supplied through outlets connected to the chamber floor.

A plurality of detachable injectors 180 may be connected to the gas ring 170 to direct a process gas such as $SiH_4$ or a related silicon-containing gas such as $SiF_4$, TEOS, and so on, onto the substrate 120. These gases are delivered to the substrate from the injectors 180 through injector orifices 187. Additionally, reactant gases may be delivered through outlets in the primary gas ring 170. The injectors may be made of, for example, aluminum or anodized aluminum. Although two injectors are shown in FIG. 1a, any number of injectors may be used. For example, an injector may be connected to each of the outlets on the primary gas ring 170. Preferably, eight to thirty-two injectors are employed for a 200 mm substrate.

The endpoint for plasma cleaning in the plasma processing system according to the first embodiment may be determined by either optical emission or through interferometry. In the optimal emission technique, the emission from atomic fluorine can be monitored at a wavelength of, for example, 712.5 nm. As the $SiO_2$ from the internal chamber surfaces clears, the F emission increases. Alternatively, the SiF line may be monitored at a wavelength of, for example, 777 nm. In this case, the emission decreases and levels off to a low value when the $SiO_2$ is removed from the internal chamber surfaces.

An alternative method of determining the endpoint of the plasma cleaning is to use an interferometric technique to monitor the thickness of the chamber wall deposits, as shown in FIG. 1b. To use interferometry as an endpoint for plasma cleaning, a transparent window 190, with an index of refraction different from the deposition film, is provided on a chamber wall. This window serves as the reflective surface for the interferometric measurement. A light source 200 directs a coherent monochromatic light beam 205 onto the window 190 at near normal incidence, and the reflected beam 207 is detected with a suitable photodetector 210, equipped with a bandpass filter. For $SiO_2$ deposition (index of refraction approximately 1.47) a sapphire window can be used (index of refraction approximately 1.77) as the reflective window surface 190 within the chamber, and a helium neon laser (wavelength approximately 632 nm) may be used as the light source 200. By directing the HeNe beam onto the sapphire window during the plasma cleaning process and monitoring the interference pattern of the reflected beam, the remaining thickness of the $SiO_2$ film on the sapphire window can be monitored, which is indicative of other surfaces within the chamber. Alternatively, an inexpensive (red) solid state laser diode may be used as the coherent light source 200.

While the $SiO_2$ film on the sapphire window etches during the cleaning process, the intensity on the photodetector will show a periodic change in intensity. When the film finally clears from the sapphire window, the signal on the detector becomes constant. This is shown in FIG. 1c. Referring to FIG. 1c, the reflected intensity varies periodically until the $SiO_2$ film thickness on the sapphire window becomes 0 Angstroms, at which point the reflected intensity becomes constant. The point at which the reflected intensity detected by the photodetector becomes constant is the endpoint of the chamber cleaning.

The use of interferometry is generally described in Marcous, P. J. and P. D. Foo, *Methods of End Point Detection for Plasma Etching*, Solid State Technology, pp. 115–122 (April 1981).

FIG. 2 illustrates a plasma processing system according to a second embodiment of the present invention. The plasma processing system illustrated in FIG. 2 is similar to that shown in FIG. 1a, except that the primary ring 170 in FIG. 2 is cantilevered and water-cooled. According to this embodiment, reactant gas is delivered through openings in the gas ring 170 which may be oriented in any direction. Preferably, some of the openings are directed towards the substrate to enhance the deposition rate.

The water cooling of the gas ring 170 may be accomplished by using two independent welded tubes 185 as shown in FIG. 2 or by using a dual tube structure. Alternatively, a water cooling tube (not shown) may be spirally wrapped around the gas ring 170. The water cooling provides thermal control to minimize flaking from the gas ring and also prevents excessive heating of the gas ring due to high density plasma exposure.

Additionally, radiative cooling may be used to limit the chamber wall and gas ring temperatures and prevent thermal decomposition. Also, although not shown, optical emission or interfometry may be used to determine an endpoint for the chamber cleaning in this embodiment, as described above.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of depositing a silicon containing layer on a semiconductor substrate, comprising:

(a) transferring a semiconductor substrate into a CVD chamber;

(b) depositing a silicon containing layer on the semiconductor substrate in the CVD chamber by supplying a process gas to the CVD chamber, the supplying including supplying the process gas to the CVD chamber by an upper gas ring and a cantilevered lower gas ring located between the upper gas ring and the semiconductor substrate, wherein during the depositing of the silicon containing layer the lower gas ring is cooled and silicon containing deposits are formed on interior surfaces of the CVD chamber;

(c) removing the semiconductor substrate from the CVD chamber;

(d) introducing a cleaning gas comprising a fluorine-based gas into the CVD chamber;

(e) forming a high density plasma by exposing the cleaning gas to an inductive field generated by an RF antenna coil; and (f) performing a plasma cleaning step by contacting the interior surfaces of the chamber with the high density plasma for a time sufficient to remove the deposits on the interior surfaces.

2. The method of claim 1, wherein the chamber forms a portion of a plasma chemical vapor deposition reactor and the depositing step comprises delivering the process gas into the chamber and energizing the process gas into a plasma.

3. The method of claim 1, wherein the cleaning gas includes a discharge stabilizing gas comprising 50% or less by volume of the cleaning gas.

4. The method of claim 1, wherein the lower gas ring includes a plurality of outlets through which the process gas is supplied into the chamber.

5. The method of claim 4, wherein the lower gas ring further comprises one or more injectors connected to at least some of the outlets in the lower gas ring, each of the injectors having an orifice in fluid communication with one of the outlets, and wherein the depositing step comprises supplying the process gas into the chamber through the orifices in the injectors.

6. The method of claim 5, wherein the cleaning gas is introduced into the chamber through the orifices in the injectors.

7. The method of claim 1, wherein the RF antenna coil is disposed external to the chamber, proximate to a dielectric shield which forms a part of an enclosure of the chamber.

8. The method of claim 1, wherein the silicon containing layer is selected from the group consisting of amorphous silicon, silicon oxide, silicon nitride, fluorinated silicon oxide and silicon oxynitride and the deposits formed on interior surfaces of the CVD chamber comprise silicon oxide, amorphous silicon, silicon nitride or silicon oxynitride.

9. The method of claim 1, wherein the silicon containing gas is selected from the group consisting of $SiH_4$, $SiF_4$ and TEOS, the process gas further comprises Ar and/or $O_2$ and/or the fluorine-based gas comprises $NF_3$, $SF_6$, a fluorocarbon or mixtures thereof.

10. The method of claim 1, wherein a flow rate of the fluorine-based gas is in the range of from about 200 to 500 sccm and the RF antenna is supplied 1500 to 3000 Watts during the plasma cleaning step.

11. The method of claim 1, wherein the cleaning gas comprises 100% by volume of the fluorine-based gas.

12. The method of claim 1, wherein the cleaning gas further comprises a discharge stabilizing gas.

13. The method of claim 12, wherein the discharge stabilizing gas is selected from the group consisting of $O_2$, Ar, He, Ne, Kr, $Cl_2$ and $BCl_3$.

14. The method of claim 12, wherein a flow rate of the discharge stabilizing gas is in the range of from about 250 sccm or less.

15. The method of claim 1, wherein the cleaning removes deposits at a rate of at least 0.66 $\mu$m of deposited material per minute.

16. A method of depositing a silicon containing layer on a semiconductor substrate, comprising steps of:

(a) transferring a semiconductor substrate into a CVD chamber;

(b) depositing a silicon containing layer on the semiconductor substrate in the CVD chamber by supplying Ar and $O_2$ gases to the CVD chamber by an upper gas ring and by supplying $SiH_4$ gas to the CVD chamber by a cantilevered lower gas ring, the lower gas ring being located between the upper gas ring and the semiconductor substrate and being cooled, and energizing the gases in the CVD chamber into a plasma state, wherein during the depositing step silicon containing deposits are formed on interior surfaces of the CVD chamber;

(c) removing the semiconductor substrate from the CVD chamber;

(d) introducing a cleaning gas comprising a fluorine-based gas into the CVD chamber;

(e) forming a high density plasma by exposing the cleaning gas to an inductive field generated by an RF antenna coil; and (f) performing a plasma cleaning step by contacting the interior surfaces of the chamber with the high density plasma for a time sufficient to remove the deposits on the interior surfaces.

17. A method of depositing a silicon containing layer on a semiconductor substrate, comprising steps of:

(a) transferring a semiconductor substrate into a CVD chamber;

(b) depositing a silicon containing layer on the semiconductor substrate in the CVD chamber by supplying a silicon containing gas to the CVD chamber through openings in a water-cooled and cantilevered gas ring wherein at least one of the openings in the gas ring is oriented to direct the silicon containing gas towards the substrate and wherein silicon containing deposits are formed on interior surfaces of the CVD chamber during the depositing step;

(c) removing the semiconductor substrate from the CVD chamber;

(d) introducing a cleaning gas comprising a fluorine-based gas into the CVD chamber;

(e) forming a high density plasma by exposing the cleaning gas to an inductive field generated by an RF antenna coil;

(f) performing a plasma cleaning step by contacting the interior surfaces of the chamber with the high density plasma for a time sufficient to remove the deposits on the interior surfaces; and (g) terminating the plasma cleaning step, wherein the terminating step comprises optically monitoring the emission from atomic fluorine and terminating the cleaning step when the monitored emission reaches a predetermined value or measuring a thickness of a chamber wall deposit by interferometry and terminating the cleaning step when the measured thickness of the chamber wall deposit reaches a predetermined value.

\* \* \* \* \*